(12) United States Patent
Mujica-Parodi et al.

(10) Patent No.: US 11,061,093 B2
(45) Date of Patent: Jul. 13, 2021

(54) DYNAMIC PHANTOM FOR FUNCTIONAL MAGNETIC RESONANCE IMAGING

(71) Applicant: THE RESEARCH FOUNDATION FOR THE STATE UNIVERSITY OF NEW YORK, Albany, NY (US)

(72) Inventors: Lilianne Mujica-Parodi, Stony Brook, NY (US); Helmut Strey, Stony Brook, NY (US); Daniel Dedora, Garden City, NY (US)

(73) Assignee: THE RESEARCH FOUNDATION FOR THE STATE UNIVERSITY OF NEW YORK, Albany, NY (US)

( * ) Notice: Subject to any disclaimer, the term of this patent is extended or adjusted under 35 U.S.C. 154(b) by 509 days.

(21) Appl. No.: 15/739,259

(22) PCT Filed: Jun. 29, 2016

(86) PCT No.: PCT/US2016/040219
§ 371 (c)(1),
(2) Date: Dec. 22, 2017

(87) PCT Pub. No.: WO2017/004277
PCT Pub. Date: Jan. 5, 2017

(65) Prior Publication Data
US 2019/0072629 A1 Mar. 7, 2019

Related U.S. Application Data

(60) Provisional application No. 62/185,919, filed on Jun. 29, 2015.

(51) Int. Cl.
*G01R 33/48* (2006.01)
*G01R 33/58* (2006.01)

(52) U.S. Cl.
CPC ......... *G01R 33/4806* (2013.01); *G01R 33/58* (2013.01)

(58) Field of Classification Search
CPC .............................. G01R 33/4806; G01R 33/58
See application file for complete search history.

(56) References Cited

U.S. PATENT DOCUMENTS 4,602,035 A 7/1986 Tegeler et al.
4,625,168 A * 11/1986 Meyer .................. G01R 33/58
324/300

(Continued)

FOREIGN PATENT DOCUMENTS

WO WO 2014/201571 A1 12/2014

OTHER PUBLICATIONS

International Search Report dated Sep. 15, 2016 issued in PCT/US2016/040219.

(Continued)

*Primary Examiner* — Michael T Rozanski
(74) *Attorney, Agent, or Firm* — Scully, Scott, Murphy & Presser, P.C.

(57) ABSTRACT

A dynamic phantom for use with a functional magnetic resonance imaging (fMRI) device is described. In one example, the dynamic phantom includes an outer housing, an inner cylinder including a removable divider, and a gearbox that can rotate the cylinder, all of which are made from fMRI-compatible materials. The divider forms longitudinal compartments inside the cylinder that can each contain a contrast material. When the cylinder contains contrast materials having at least two different concentrations, and a space between the cylinder and the housing also contains a contrast material, rotation of the cylinder produces biomimetic hemodynamic signals that may be detected by the fMRI device.

19 Claims, 13 Drawing Sheets
(10 of 13 Drawing Sheet(s) Filed in Color)

(56) References Cited

U.S. PATENT DOCUMENTS

2010/0047752 A1     2/2010   Chan et al.
2011/0228910 A1     9/2011   Gregerson et al.

OTHER PUBLICATIONS

Olsrud et al., "A two-compartment gel phantom for optimization and quality assurance in clinical BOLD fMRI." Magnetic Resonance Imaging (2008), pp. 279-285, [online] <URL: http://www.academia.edu/15001808/A_twocompartment_gel_phantom_for_optimization_and_qualily_assurance_in_clinical_BOLD_fMRI>.
Baltisberger et al., "Multi-dimensional magnetic resonance imaging in a stray magnetic field." Journal of Magnetic Resonance (2005), pp. 79-84, [online] <URL:http://chemistry.berea.edu/articles/Baltisberger_172_2005_JMR.pdf>.
Dedora, "Temporal fidelity and functional dynamics in functional MRI time-series analyses." Stony Brook University the Graduate School, Apr. 15, 2015 (Jun. 15, 2015), pp. 1 [online]<URL: https://www.grad.stonybrook.edu/pdf/academics/ddd/Daniel%20Dedora.pdf>.
Extended Supplementary European Search Report dated Jan. 29, 2019 received in European Patent Application No. 16 81 8733.4.
European Office Action dated Oct. 5, 2020 received in European Application No. 16 818 733.4.
Office Action dated Mar. 12, 2021 received in European Patent Application No. EP 16818733.4.

\* cited by examiner

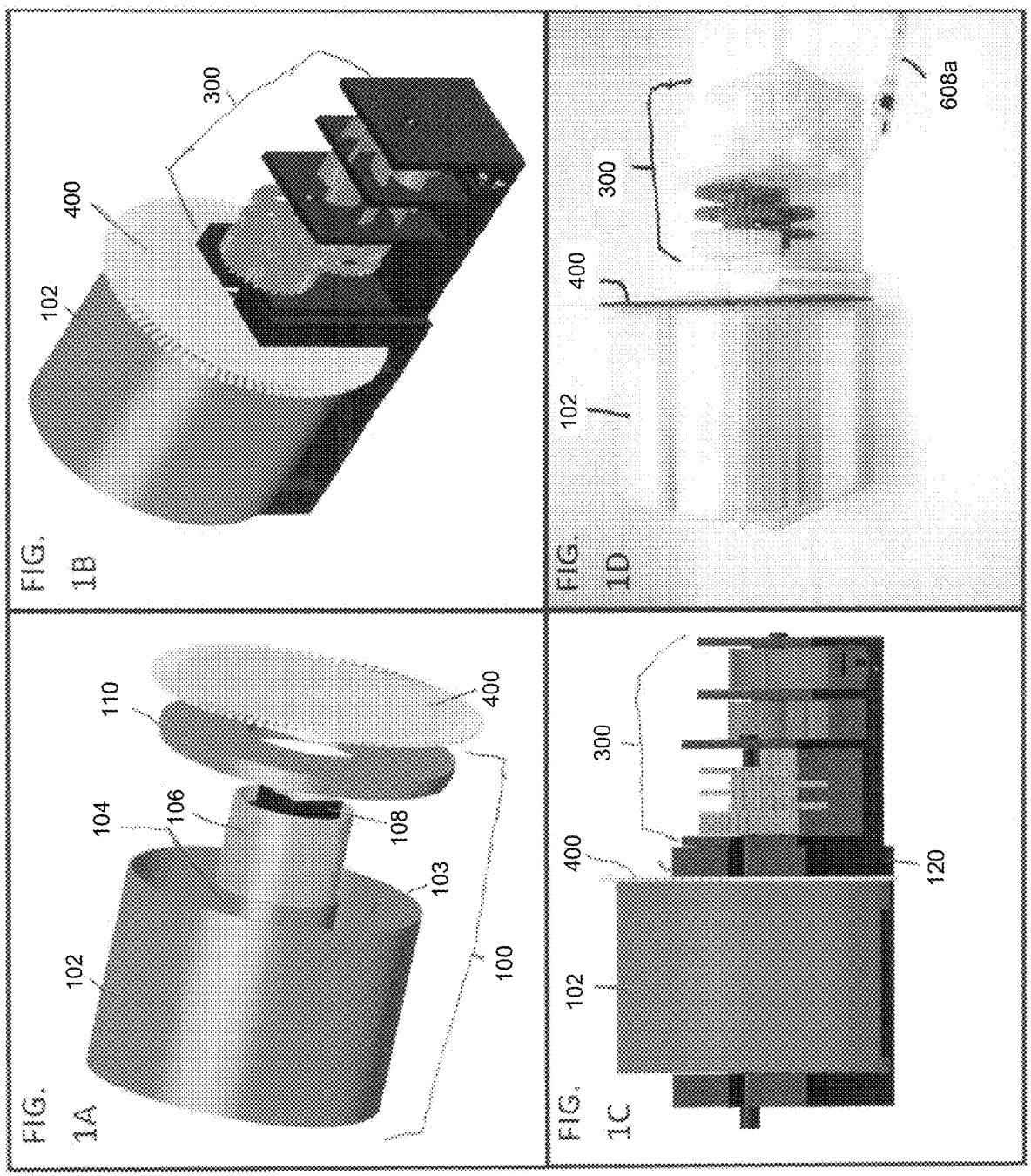

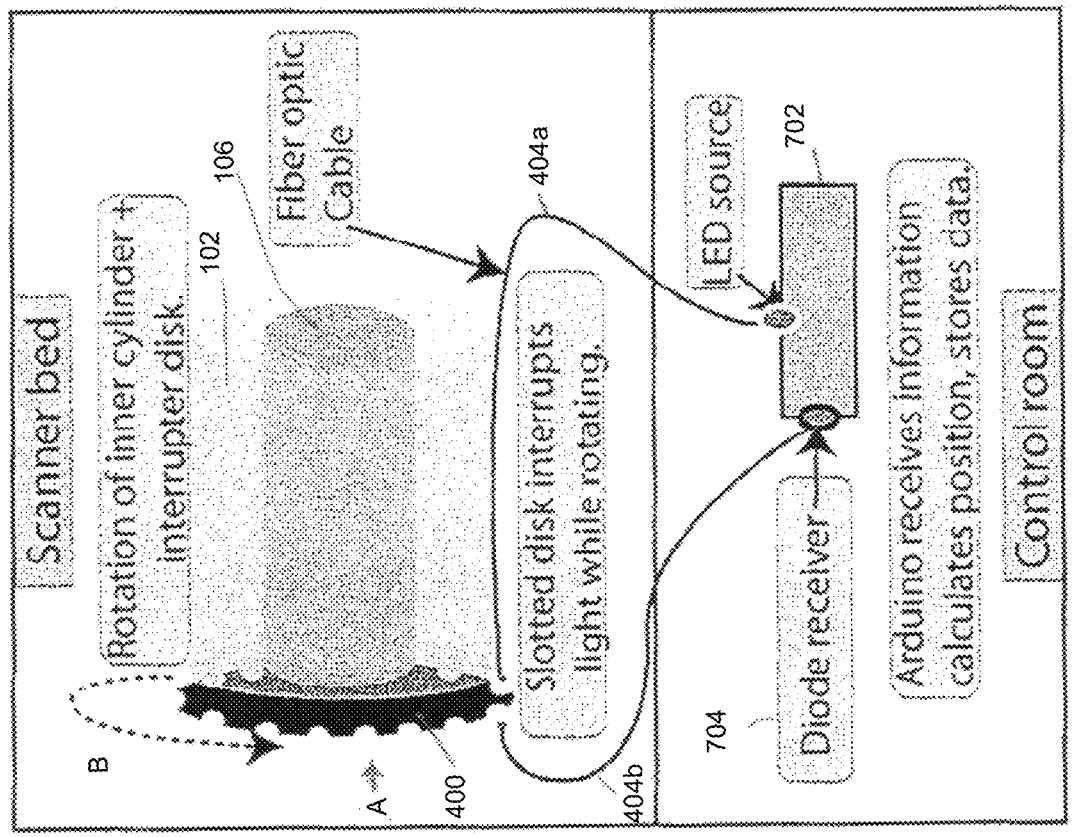
FIG. 7
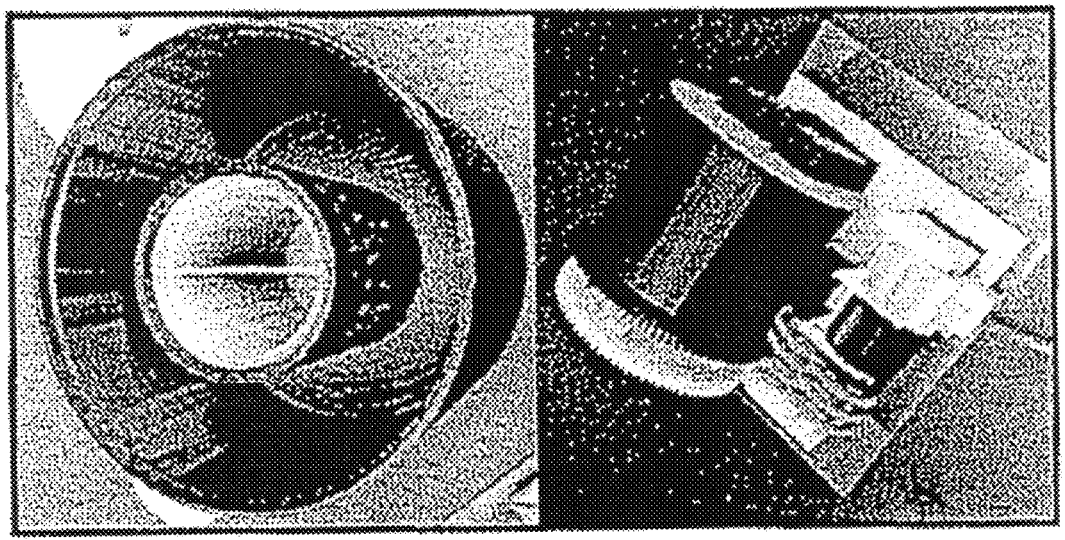
FIG. 5A
FIG. 5B

DYNAMIC PHANTOM FOR FUNCTIONAL MAGNETIC RESONANCE IMAGING

CROSS-REFERENCE TO RELATED APPLICATIONS

This application is a national stage application, filed under 35 U.S.C. § 371, of International Application No. PCT/US2016/040219, filed Jun. 29, 2016, which claims the benefit under 35 U.S.C. § 119(e) of U.S. Provisional Application Ser. No. 62/185,919, filed Jun. 29, 2015. The entire contents and disclosure of the aforementioned applications are incorporated by reference as if fully set forth herein.

STATEMENT REGARDING FEDERALLY SPONSORED RESEARCH

The present disclosure was made with government support under grant CBET0954643 awarded by the National Science Foundation. The government has certain rights in the disclosure.

BACKGROUND

The present disclosure relates generally to the field of functional magnetic resonance imaging (fMRI) and, more particularly, to a dynamic phantom for producing simulated brain-activity-related signals that may be detected by a fMRI scanner.

Magnetic resonance imaging (MRI) is typically used to obtain detailed pictures of organs and tissues inside the human body. An MRI machine frequently includes a large tube-shaped magnet in which a patient lies down. When the hydrogen atoms in the body (mostly in water molecules) are subjected to the relatively strong magnetic field produced by the MRI machine's magnet, the nucleus in each atom is temporarily aligned in the general direction of the magnetic field. Radio waves properly applied to the multiple aligned hydrogen nuclei create a faint signal—the magnetic resonance (MR) signal—that is detected by radio frequency coils in the MRI machine and is used to create cross-sectional images. Such cross-sectional "slices" can be displayed as two-dimensional pictures or assembled into three-dimensional images.

When an MRI system obtains images of the brain, structures such as the brainstem, cerebellum, and the four lobes of the cerebral cortex can be seen. These structures are largely made up of nerve cells (neurons) that carry electrical brain signals. Such signals make up brain activities or functions. For example, the brain structure known as the frontal lobe is associated with brain activities related to reasoning, planning, parts of speech, movement, emotions, and problem-solving. To obtain data on brain activity, connectivity, or function (including their visualization), functional magnetic resonance imaging (fMRI) is used.

The basis for fMRI is that increases or decreases in activity by neurons in a region of the brain result in increases or decreases in blood flow in that brain region, which in turn increases or decreases the MR signal. This indirect effect that brain-activity changes have on the MR signal can be detected in a number of ways. One way is to measure changes in blood flow using arterial spin labeling (ASL), which manipulates the MR signal of arterial blood before it flows to different brain regions. Another way measures blood flow indirectly by detecting changes to the amount of oxygen in the blood, which is known as the blood oxygenation level dependent (BOLD) effect.

SUMMARY

According to one embodiment of the invention, an apparatus for use with a functional magnetic resonance imaging (fMRI) device includes an fMRI-compatible housing; an fMRI-compatible support structure within and attached to the housing; an fMRI-compatible rotor supported within the housing by the support structure; a first magnetic-resonance-contrast-producing material filling a space between an outer surface of the rotor and an inner surface of the housing; one or more other suitable magnetic-resonance-contrast-producing materials filling a space within the rotor, such that longitudinal rotation of the rotor produces biomimetic hemodynamic signals that may be detected by the fMRI device; and an fMRI-compatible actuator operatively connected to the rotor.

According to another embodiment of the invention, the apparatus further includes a power unit capable of powering the actuator; a control unit operatively connected to the power unit and the actuator; a position indicator operatively connected to the rotor; and a feedback unit operatively connected to the position indicator and the control unit.

According to yet another embodiment of the invention, an apparatus for use with a functional magnetic resonance imaging (fMRI) device, includes an fMRI-compatible housing; an fMRI-compatible support structure within and attached to the housing; an fMRI-compatible rotor that: is supported by the support structure such that a first magnetic-resonance-contrast-producing material can be contained in a space between an outer surface of the rotor and an inner surface of the housing; and is capable of longitudinal rotation that, when the rotor contains one or more suitable other magnetic-resonance-contrast-producing materials, produces biomimetic hemodynamic signals that may be detected by the fMRI device; and an fMRI-compatible actuator operatively connected to the rotor.

According to still another embodiment of the invention, the apparatus further includes a control unit operatively connected to the power unit and the actuator; a position indicator operatively connected to the rotor; and a feedback unit operatively connected to the position indicator and the control unit.

According to a further embodiment of the invention, a method for using a functional magnetic resonance imaging (fMRI) device includes a first step of placing first, second, and third magnetic-resonance-contrast-producing materials within an apparatus that includes an fMRI-compatible housing; an fMRI-compatible support structure within and attached to the housing; an fMRI-compatible rotor supported within the housing by the support structure; a first magnetic-resonance-contrast-producing material filling a space between an outer surface of the rotor and an inner surface of the housing; one or more suitable other magnetic-resonance-contrast-producing materials filling a space within the rotor, such that longitudinal rotation of the rotor produces biomimetic hemodynamic signals that may be detected by the fMRI device; and an fMRI-compatible actuator operatively connected to the rotor; a second step of causing the actuator to rotate the rotor; and a third step of detecting the biomimetic hemodynamic signals.

These and other aspects and advantages of the current disclosure will become apparent from the following detailed description considered in conjunction with the accompanying drawings. It is to be understood, however, that the drawings are designed solely for purposes of illustration and not as a definition of the limits of the disclosure, for which reference should be made to the appended claims. Moreover, the drawings are not necessarily drawn to scale and, unless otherwise indicated, they are merely intended to conceptually illustrate the structures and procedures described herein.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 1A is an exploded schematic perspective view of a phantom and an interrupter disc according to one embodiment of the invention.

FIG. 1B is a schematic perspective view of a phantom, interrupter disc, and gearbox according to one embodiment of the invention.

FIG. 1C is a schematic side view of the elements shown in FIG. 1B.

FIG. 1D is a photograph of a phantom, interrupter disc, gearbox, and pneumatic tubes according to one embodiment of the invention.

FIG. 5A is a photograph of portions of a phantom according to one embodiment of the invention.

FIG. 5B a photograph of a phantom, interrupter disc, gearbox, and pneumatic tubing according to one embodiment of the invention.

FIG. 7 is a schematic diagram of a feedback system used with a phantom according to one embodiment of the invention.

DETAILED DESCRIPTION OF EXEMPLARY EMBODIMENTS

A phantom according to the present invention may be used in a two-system configuration, including: the scanned phantom, which in conjunction with an fMRI machine produces fMRI signals, as the first system; a control unit, which provides fMRI communication, as the second system; and an interface between the two systems, which provides automated rotation and feedback.

System I—The Scanned Phantom

Figures 9A, 9B, 9C, 9D:
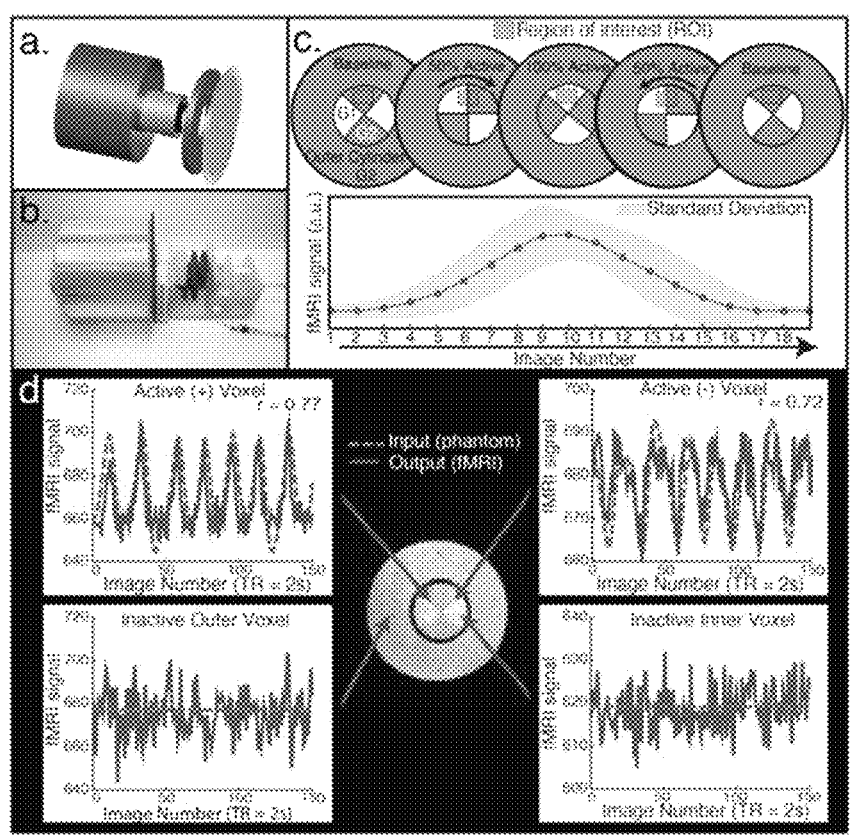
FIG. 9a is a similar exploded schematic perspective view of the phantom depicted in FIG. 1A according to one embodiment of the invention.
FIG. 9b is a side view photograph of a phantom, interrupter disc, gearbox, and pneumatic tubes according to one embodiment of the invention.
FIG. 9c is a conceptual representation of pseudo-BOLD signal production mechanism, and empirically measured signal change.
FIG. 9d includes graphs illustrating dynamic phantom data acquisition for a phantom according to one embodiment of the invention.

FIGS. 1A-1D show one example of a phantom in accordance with the invention, along with additional operating elements. A similar example is also shown in FIGS. 9a and b. Phantom 100 includes: housing 102; rotor 106 situated in support sleeve 104, which is attached to housing 102; compartment divider 108; and cover 110. In this example, housing 102, support sleeve 104 and rotor 106 are all substantially cylindrical. Housing 102 may be referred to as the outer cylinder, and rotor 106 may be referred to as the inner cylinder.

Figure 1E:
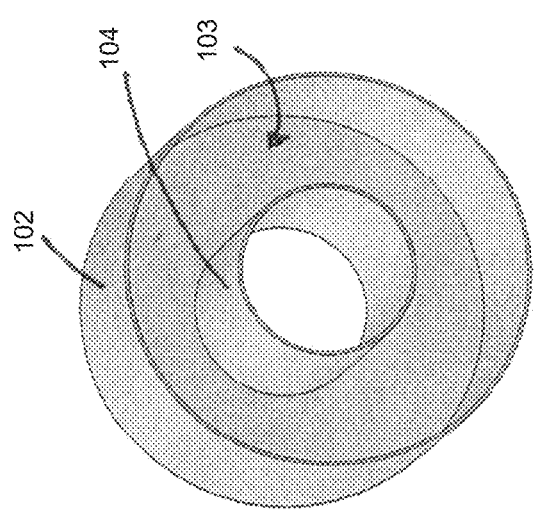
FIG. 1E is a schematic perspective view of the housing shown in FIGS. 1A-1D.

Referring to FIG. 1E, the chamber or space 103 between the inner surface of housing 102 and the outer surface of support sleeve 104 is capable of receiving a magnetic-resonance-contrast-producing material, or contrast medium. Exemplary suitable materials include agarose gel, various hydrogels, and silicon compounds such as polydimethylsiloxane (PDMS).

Within housing 102, additional chambers may be included that mimic the differing relaxation properties of brain tissue or cerebral spinal fluid, or both, across various MRI paradigms. Furthermore, well-defined structural features (such as those incorporated into standard geometry phantoms) may also be incorporated into housing 102 to help calibrate for geometric accuracy.

As shown in FIG. 1A, compartment divider 108 divides the interior of rotor 106 into four longitudinal compartments. Each compartment is capable of receiving a contrast medium. Compartment divider 108 is removable, allowing the interior of rotor 106 to be filled such that, after divider 108 is removed, each contrast medium can be in direct contact with adjacent contact media.

Figure 12:
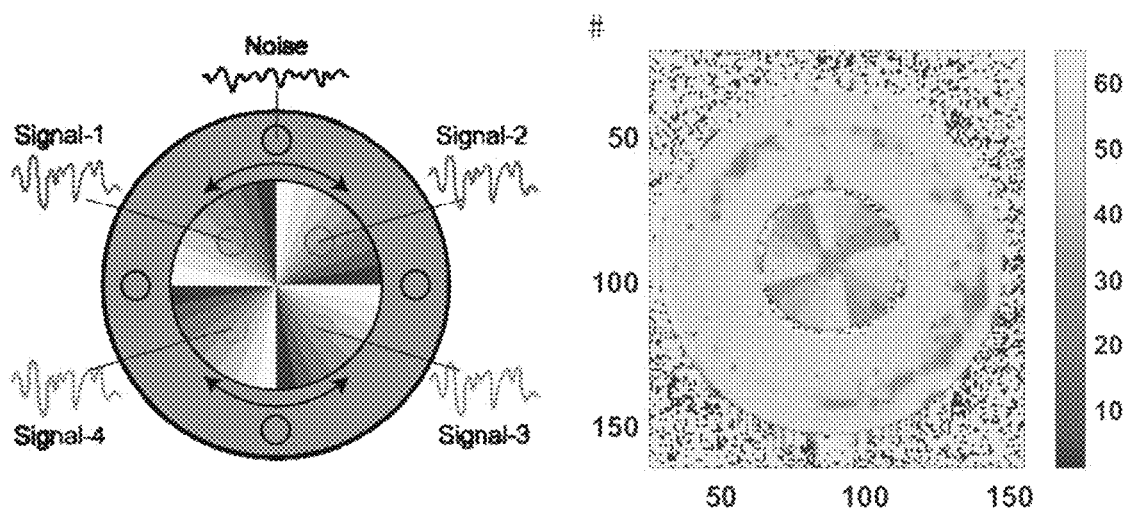
FIG. 12 includes graphs illustrating a dynamic phantom with several gradients.

In another embodiment, the compartments' contrast media can be arranged in wedges of different hydrogel concentrations forming a gradient as shown in FIG. 12. In yet another embodiment, rotor 106 has a single compartment or space that is filled with a single contrast medium (such as an agarose gel) that has a gradient of concentrations (making removable divider 108 unnecessary).

Figure 2:
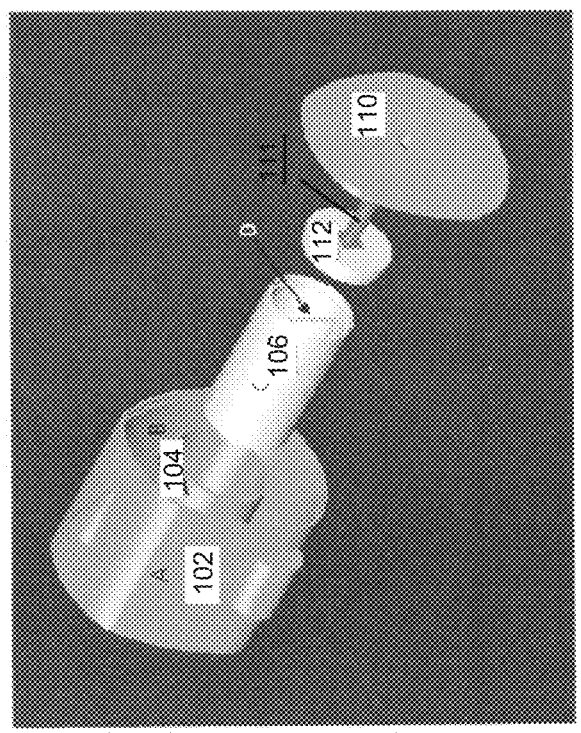
FIG. 2 is an exploded schematic perspective view of a phantom according to another embodiment of the invention.

FIG. 2 shows another example of a phantom in accordance with the invention. For this phantom 100, only rotor 106 and support sleeve 104 are substantially cylindrical. Housing 102 (also identified as "A" in FIG. 2) is generally cylindrical but asymmetric, and anthropomorphic, having some resemblance to the shape of a human head, including shapes that model a nose and two ears. (Only the model nose 150 and one model ear 160 are shown in FIG. 2.) In other embodiments, housing 102 could have other asymmetries and may or may not be anthropomorphic. If anthropomorphic, housing 102 could resemble a human head more closely (e.g., including a shape modeling a forehead) or less closely (e.g., excluding the nose and ear shapes).

Also in the example shown in FIG. 2, compartment divider 108 (indicated by arrow D) divides the interior of rotor 106 into two longitudinal compartments. The rotor is also identified as "C". Again, each compartment is capable of receiving a contrast medium, and compartment divider 108 is removable, allowing the interior of rotor 106 to be filled such that each contrast medium can be in direct contact with the other contact medium. The inner FIG. 5A shows an example of a two-compartment rotor 106 in a cylindrical housing 102. Cap 112, which engages a rotorshaft 111 and rotor 106, is also provided.

When operated, phantom 100—such as the examples in either FIG. 1A or FIG. 2—is filled with at contrast media in space 103 and in the two or more compartments in rotor 106. At least one of the contrast media in the compartments must have a different concentration than at least one other contrast medium in the compartments.

In other words, phantom 100 could be said to use at least three contrast media: a first magnetic-resonance-contrast-producing material in space 103; a second material in one of the compartments in rotor 106; and a third material in another compartment in rotor 106. The second material must have a different concentration from the third material, with the difference in concentrations sufficient to produce activated fMRI signal changes at the interface of the materials (i.e., biomimetic hemodynamic signals) when rotor 106 rotates within housing 102. The first material (in space 103) may have the same concentration as the second or third material, or may differ from the second and third material.

For example, a prototype phantom (see, e.g., FIG. 9a and FIG. 9b) has been tested and produced useful results with the following: the first material is agarose gel at a 2.27% concentration; the second material is agarose gel at 2.21%; and the third material is agarose gel at 2.27%. A space corresponding to space 103 was filled with the first gel. Four compartments in an inner cylinder corresponding to rotor 106 were filled with the second and third gels in alternating compartments. When a divider corresponding to divider 108 was removed, there were four interfaces of the second and third gels, one for each of the four pairs of adjacent compartments.

As shown in FIGS. 9a and 9b phantom uses concentric cylinders (inner and outer). Because magnetic susceptibility changes as a function of agarose concentration, precisely timed rotation of the inner cylinder between images creates a 'gradient' effect, in which different proportions of each agarose compartment pass through—and are averaged over—a region of interest. Motion across the 'gradient' thus is capable of producing smooth dynamic changes in fMRI signal (see, e.g., bottom panel of FIG. 9d). Higher concentrations produce lower surface of the housing is shown in FIG. 2 as "B".

dMRI Signals.
Interface—Automated Rotation

One example of components that can provide automated rotation of phantom 100 is a pneumatic motor system. The inner cylinder is rotated while the outer cylinder remains motionless.

Certain components of one example of a pneumatic motor system are shown in FIGS. 1A-1D, and in more detail in FIGS. 3A-3D. Into support structure 120 (which may be a single piece or an assembly of multiple pieces) are situated: phantom 100 (placed to enable rotor 106 to rotate when driven by rotorshaft 111) and actuator 300, which comprises gears 304, 305, and 306, and fans 308. When engaged by either of fan 308a or 308b, gears 304, 305, and 306 drive rotorshaft 111, which in turn rotates rotor 106. One end of the rotorshaft 111 is coupled to the rotor 106 and the other to gears 306.

Figure 3B:
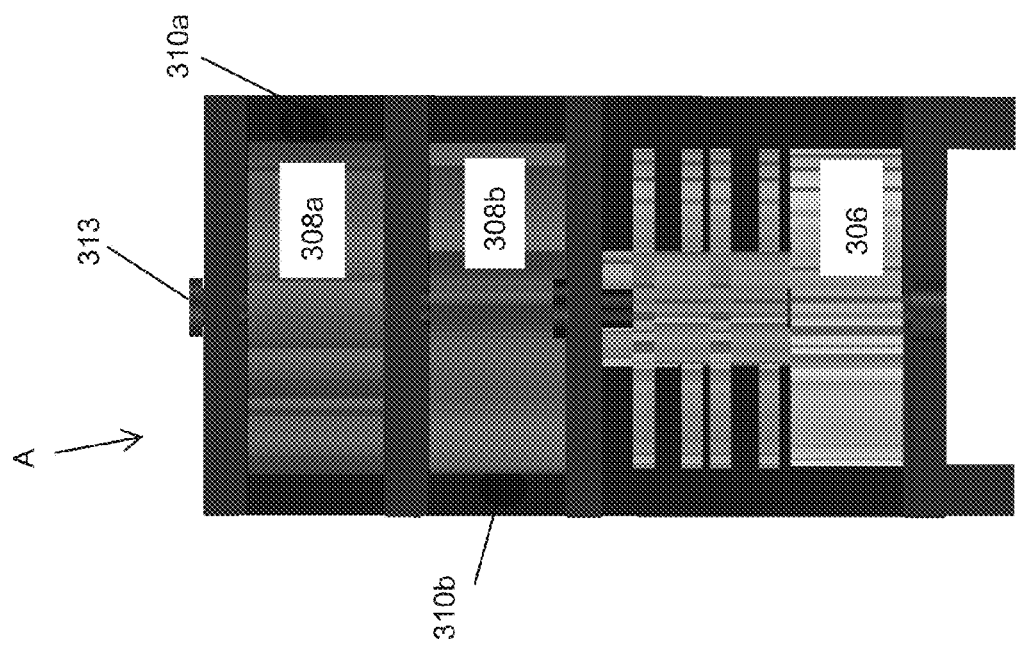
FIG. 3B is a schematic top view of the gearbox shown in FIG. 3A.
Figure 3A:
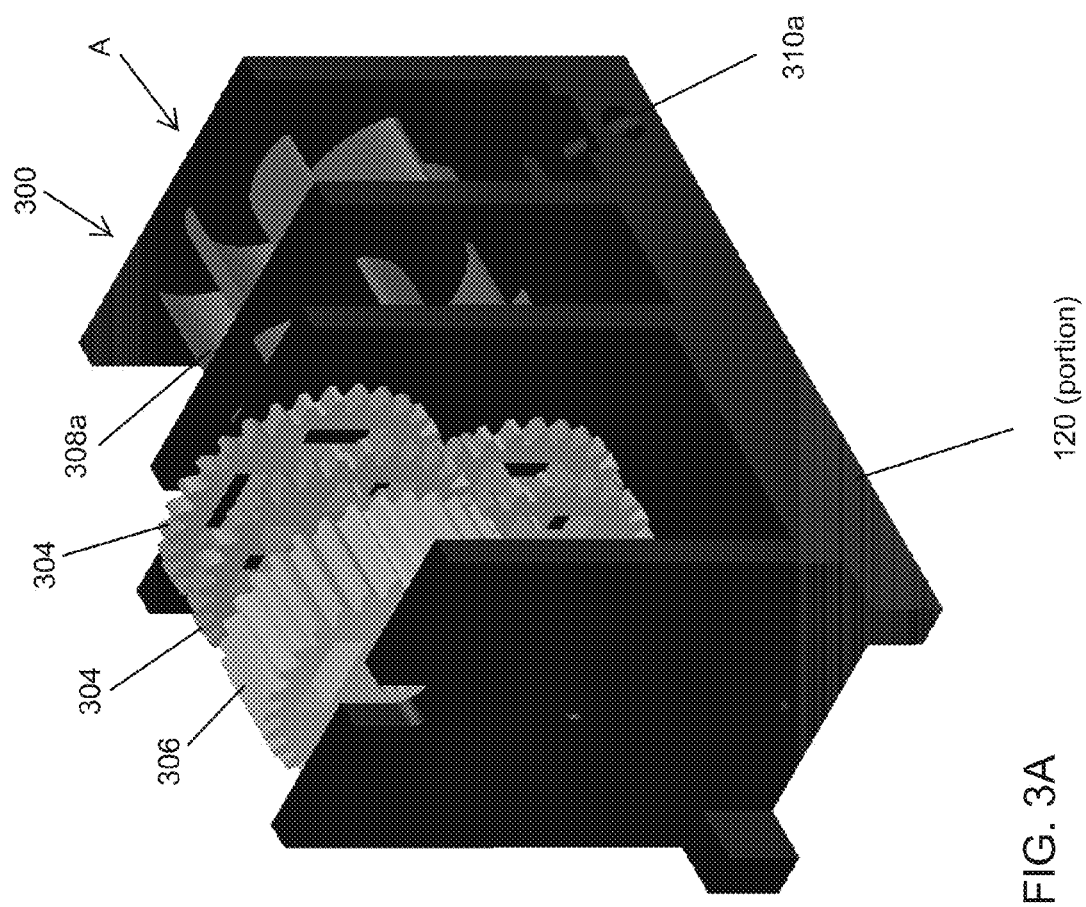
FIG. 3A is a schematic perspective view of a gearbox for use with a phantom according to the invention.
Figure 3D:
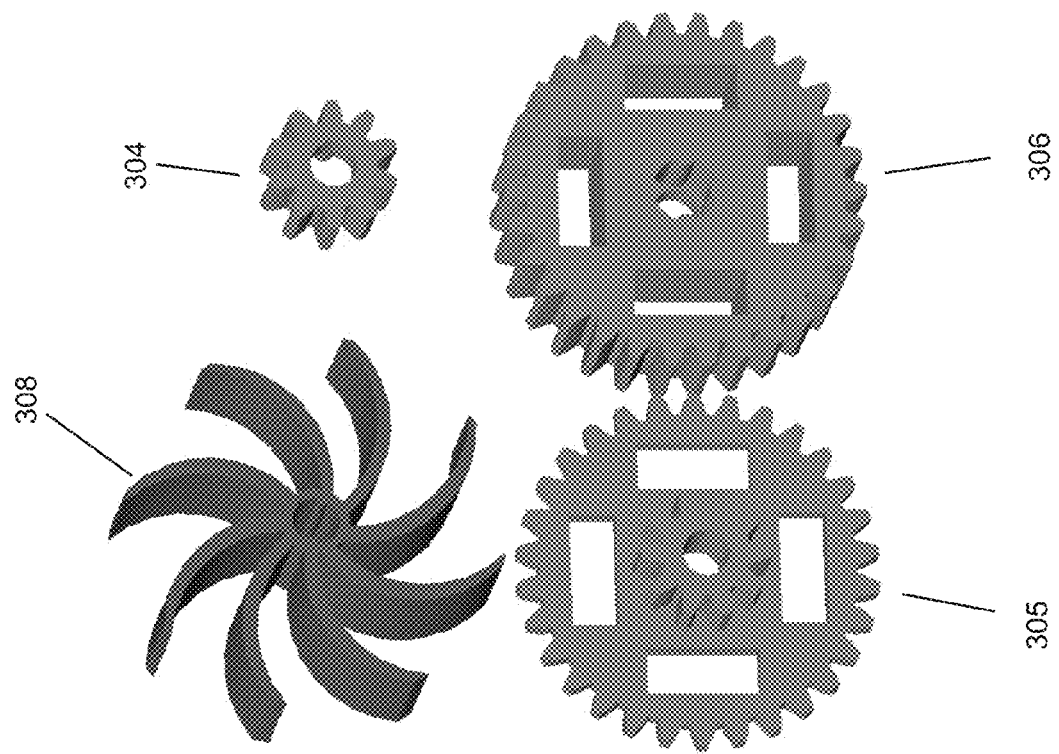
FIG. 3D is a schematic perspective view of certain elements used in the gearbox shown in FIG. 3A.
Figure 3C:
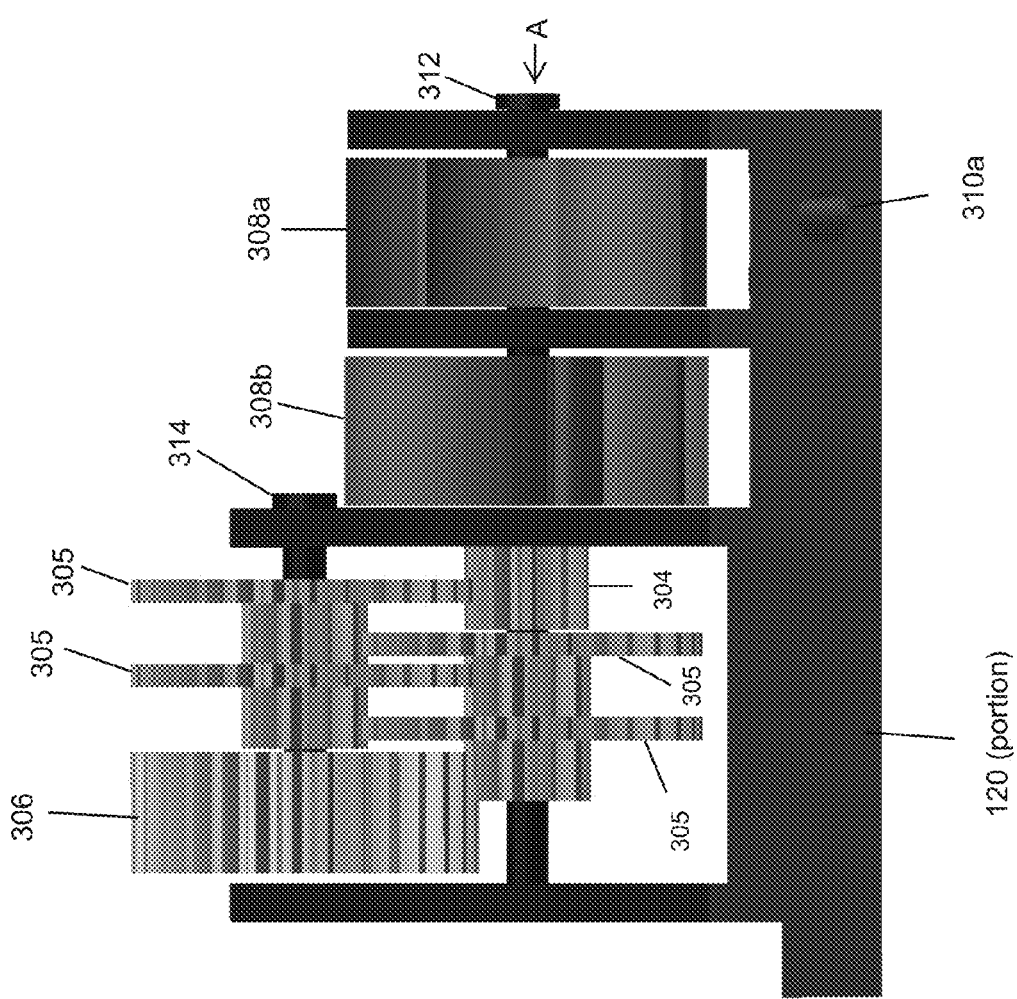
FIG. 3C is a schematic side view of the gearbox shown in FIG. 3A.
Figure 4:
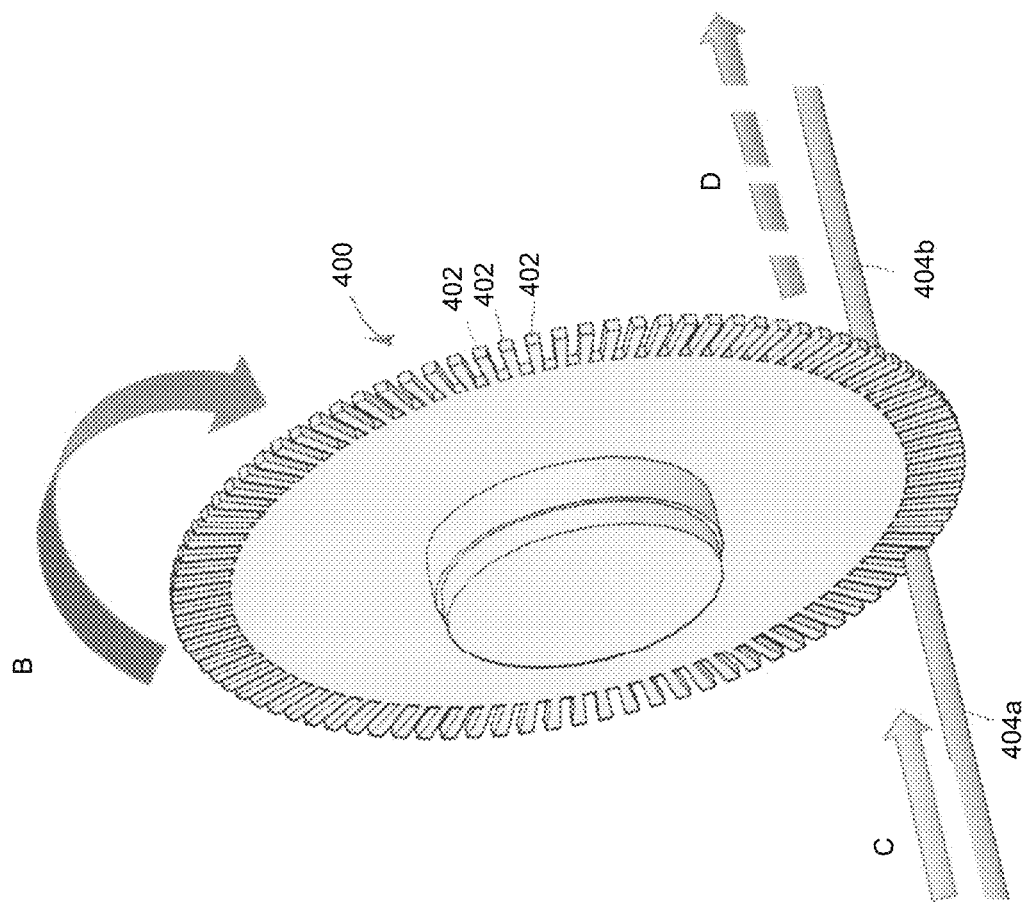
FIG. 4 is a schematic perspective view of an interrupter disc and fiber-optic cables that may be used with a phantom according to the invention.

The components depicted in FIGS. 3A, 3B, and 3C, including or excluding fans 308, may be referred to as a gearbox, actuator, or motor. (The entire pneumatic motor system may also be referred to as a motor.) A gearbox that drives rotor 106 may be placed in line with phantom 100, as shown for example in FIGS. 1B, 1C, and 1D, or off line, as shown for example in FIG. 5B or FIG. 6.

As shown in FIG. 3C, fans 308a and 308b are arranged on gearshaft 312 such that the rotation of one opposes rotation of the other. The inner portion of each fan 308 is slotted to allow rotation to translate through correspondingly slotted gearshaft 312. Input gear 304 contains slots that cause it to rotate with gearshaft 312. Thus, input gear 304 rotates in the direction of whichever fan 308 is rotating.

Input coupler gear 304 (which couple the fans to the gearbox) is meshed with a series of gears 305 and 306 to provide a step-down ratio of 243:1. Specifically, input gear 304 and two 3:1 compound gears 305 are rotatable on gearshaft 312, and two 3:1 compound gears 305 and 3:1 compound gear 306 are rotatable on gearshaft 314. Gears 305 contain no slots, and are allowed to move freely. The inner portion of output coupler gear 306 (which couples the gearbox to the phantom) is half smooth and half slotted. This arrangement allows gear 306 to translate rotation through rotorshaft 111, which ultimately interfaces with and rotates rotor 106. Gear 306, alone or together with rotorshaft 111, may also be referred to as an actuator, which imparts motion to rotor 106.

Figure 6:
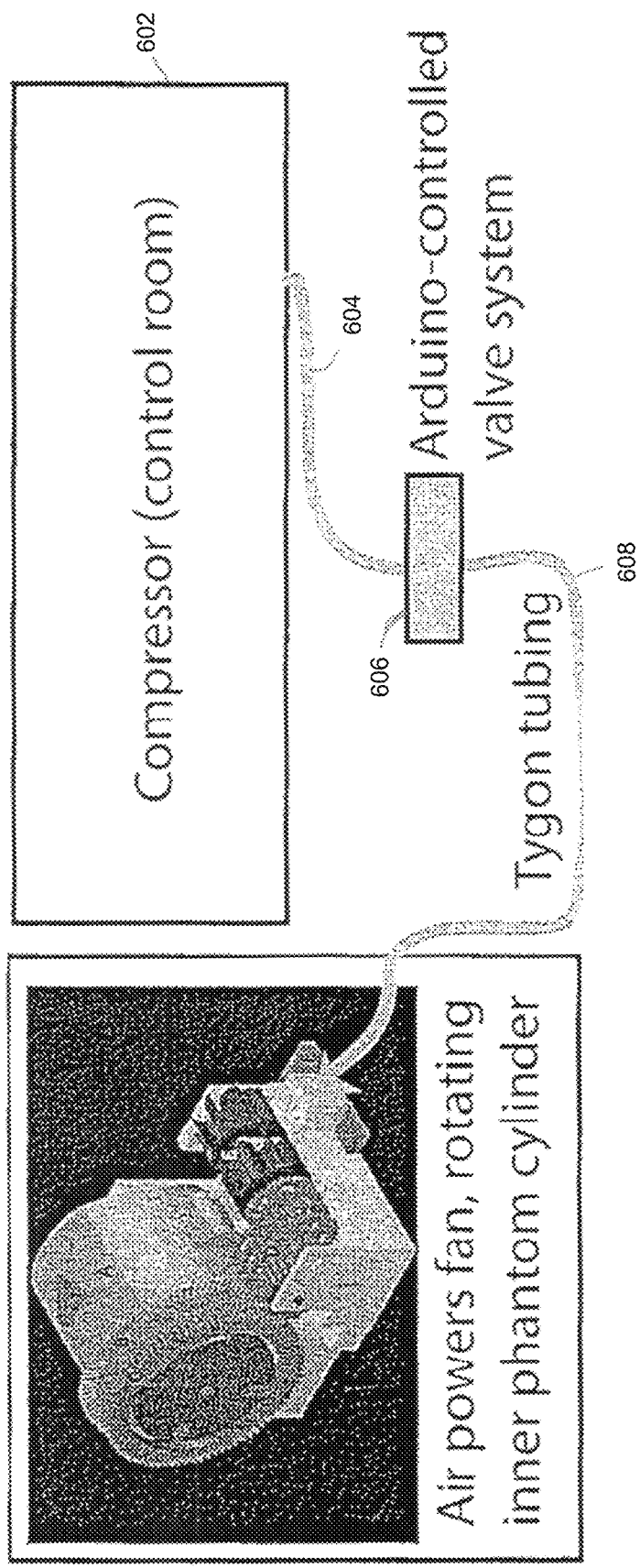
FIG. 6 is a schematic diagram of a pneumatic motor system used with a phantom according to one embodiment of the invention.
Figure 13:
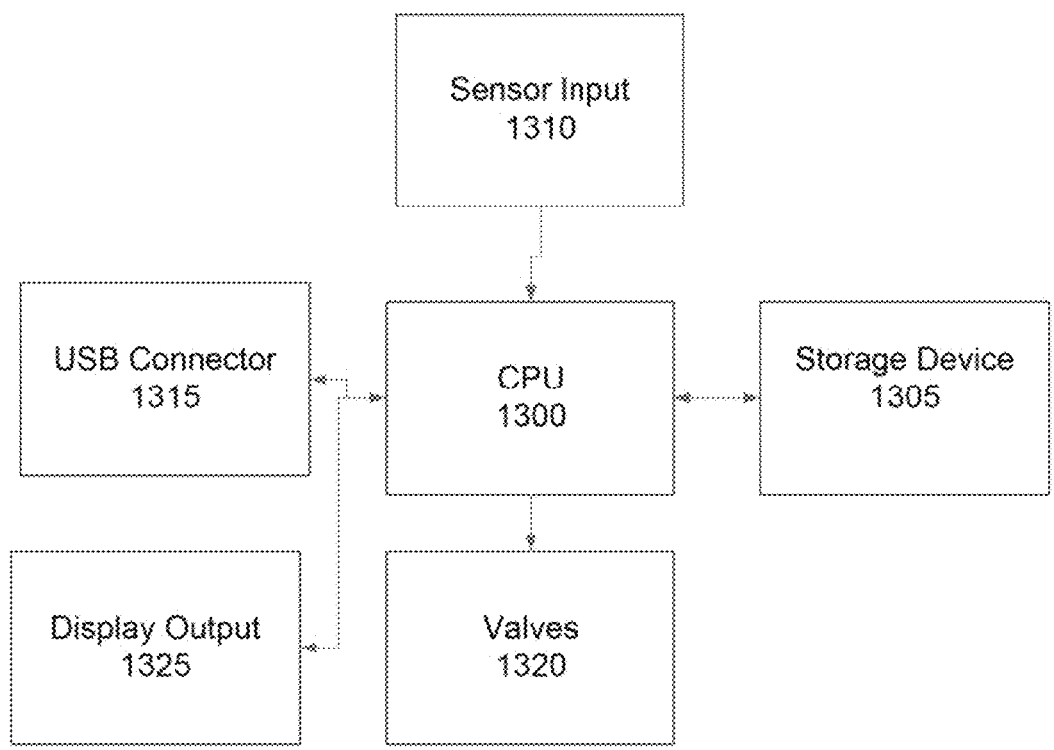
FIG. 13 is a block diagram of a controlled valve system in accordance with an embodiment of the invention.

Other components of this exemplary pneumatic motor system are a compressor, valves, manifold, and air tubes. As shown in FIG. 6, compressor 602, which may be located in a control room for operating an fMRI device, produces compressed air travels through tubing 604 to controlled valve system 606 (which is shown in FIG. 13 and controlled by CPU 1300), and then through tubing 608. The valves 1320 are independently controlled. With the gearbox depicted in FIGS. 3A, 3B, and 3C, the tubing 608 consists of two tubes 608a and 608b, which are coupled with channels 310a and 310b, respectively, to apply air pressure to fans 308a and 308b, respectively, causing fan rotation. In some embodiments, the air passage can include a splitter. Rotation of either fan 308 drives the gearbox through gearshaft 312 (a slotted peg), with rotation in one direction (counterclockwise, if viewing the gearbox along direction A in FIG. 3A, 3B, or 3C) if air flows through tube 608a and channel 310a to drive fan 308a, and in the opposite direction (clockwise) if air flows through tube 608b and channel 310b to drive fan 308b. The rapid rotation of either fan 308 is reduced by the series of compound gears 304, 305, and 306, providing torque necessary to rotate rotorshaft 111, which in turn rotates rotor 106.

Rotation of rotor 106 in either direction and precise braking of rotor 106 are thus possible by appropriately controlling airflow through tubes 608. For example, a prototype phantom and a prototype pneumatic motor system have been tested and produced useful results with the following: a GMC Syclone air compressor (for compressor 602) is set to provide input compressed air pressure of 40 pounds per square inch at 1.9 cubic feet per minute; Tygon® tubing (United States Plastic Corp.) (for tubing 604) guides the input compressed air through a splitter and into two Arduino®-controlled solenoid valves (SparkFun Electronics, Niwot, Colo.) (for controlled valve system 606. FIG. 13 being a block diagram thereof); two additional lengths of Tygon® tubing (for tubes 608a and 608b) guide compressed air and are coupled to the gearbox (at channels 310a and 310b, respectively) with conventional pneumatic connectors that release compressed air into either gearbox fan (308a or 308b), depending upon a signal provided by the Arduino controller (which is an example of a CPU 1300).

Interface—Feedback

The position of the inner cylinder is monitored by a feedback system. One example of components that can provide feedback for use of phantom 100 is a fiber-optic system.

Certain components of one example of a fiber-optic feedback system are shown in FIGS. 1A-1D, FIG. 4, or FIG. 6 FIG. 7 and FIG. 13. Interrupter disc 400 is coupled to rotor 106 using slotted cap 406. On the periphery of disc 400 are teeth 402. Two fiber-optic cables 404 are placed on placed on either side of interrupter disc 400. As rotor 106 rotates, in turn rotating disc 400, a continuous light beam C from a light source, LED 702, is guided out of cable 404a becomes a discontinuous light beam D, which is guided through fiber-optic cable 404 band received by a light detector, diode receiver 704. (In the example of FIG. 4, disc 400 rotates counterclockwise B as viewed along direction A; in the example of FIG. 7, disc 400 rotates clockwise.) When the discontinuous light beam is appropriately detected and analyzed—including real-time counting of interruptions or discontinuities—precise position and velocity data regarding rotor 106 is possible.

For example, a prototype phantom and a prototype fiber-optic feedback system have been tested and produced useful results with the following: plastic fiber-optic cables, an LED light source, a photodiode, and an interrupter disc. Before each fMRI scan, the feedback system performs a self-calibrating procedure to ensure optimal position encoding regardless of ambient light.

Specifically in the tested prototype, an Arduino microcontroller (which is an example of a CPU 1300) powers a high-powered 10 mm LED (SparkFun Electronics), which is coupled with a first 1.5 mm diameter fiber-optic cable (Thorlabs, Inc., Newton, N.J.) (for cable 404a). The first cable guides light from the LED source within control room to the scanner bed through a waveguide in the fMRI device. The first cable and a second fiber-optic cable (for cable 404b) are positioned opposite each other and spaced 5 mm apart, such that as the phantom rotor rotates, a 3-mm thick plastic interrupter disc (for disc 400) placed between the first and second cables will intermittently block continuous light transmitted from the first cable. The interrupter disc has 60 teeth (for teeth 402), corresponding to approximately 6° of rotation per interrupt. Empirical testing with the prototype phantom and feedback system shows that the phantom is capable of traversing between 0.5 and 1.5 interruptions per repetition time (TR), with one interruption being average.

The second cable receives discontinuous light and guides it through the waveguide to a photodiode on the microcontroller. As the interrupter disc spins, the photodiode receives differential intensity readings. The microcontroller then displays the interruption count as a live feed at each TR.

System II—Control Unit

A unit for controlling the scanned phantom and interface, and analyzing data received from an fMRI device used with a phantom according to the invention, is shown schematically as control unit 606 (also referred to as controlled valve system) in FIG. 6 (block diagram thereof is shown in FIG. 13). For example, a prototype control unit has been tested and produced useful results with the following: an Arduino Mega® that accepts USB input from the fMRI device. Additional details regarding the prototype control unit are provided in the following description of empirical testing.

Instead of a single control unit 606, multiple control units could be used. For example, separate control units could be used in connection with automated rotation and with feedback.

Figure 8:
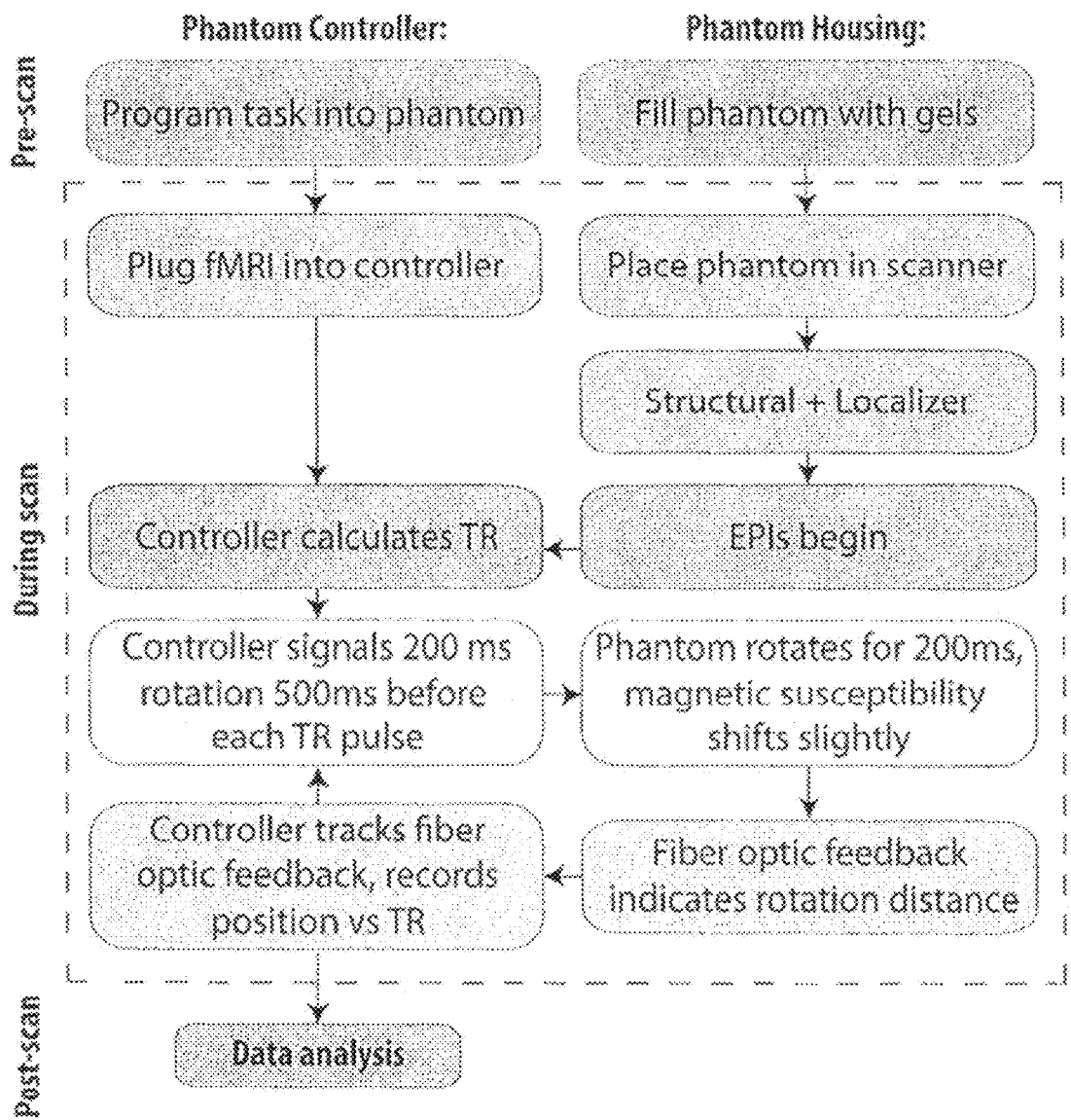
FIG. 8 is a flowchart for operation of a system using a phantom according to one embodiment of the invention.

FIG. 8 is a flowchart for operation of a total system (Systems I and II with Interface) using a phantom according to one embodiment of the invention. An overview of software code that may be used in this total system is shown below in Table 1.

TABLE 1

1. Pre-experiment programming
    a. Prior to beginning the experiment, the phantom should be programmed with the desired task using the CPU 1300. This is done with a two-column matrix, where the first column is timestamp (in seconds), and the second column is desired interrupt (integer). At each time stamp during the experiment, the phantom will begin travel to the desired interrupt.
    b. The phantom is designed to rotate a small amount between image acquisitions. Thus, the TR must be programmed a priori. The phantom should begin rotation ~600 ms prior to the end of each image acquisition, and stop rotation ~300 ms prior to the end of each image. This was empirically shown to prevent most motion artifacts.
2. Ambient light calibration
    a. The phantom comprises two valves (shown in FIG. 13 as valves 1320), coupled to tubes 608 that lead to the bidirectional fan system.
    b. The CPU 1300 (e.g., microcontroller) activates one valve for 10 seconds (arbitrarily defined), which causes the phantom to spin in one direction.
    c. The sensor (e.g., Diode receiver 704such as photodiode) reads the minimum and maximum light received during this period of time which is input to the CPU 1300 via the Sensor Input 1310 such as a wire connection.
    d. It uses the minimum and maximum to define "no interruption" (high light value), and "interruption" (no light). This is used to track interruption state constantly.
3. Experiment start
    a. The phantom begins receiving fMRI signals through a USB 1315, voltage source, or fiber optic connection with the fMRI control center. One signal is received each image acquisition (TR). The fMRI signals can be stored in the Storage Device 1305. When a microcontroller is used as a CPU, the storage device 1305 is typically integrated in the chip.

TABLE 1-continued b. The phantom determines the time at which to start rotation based on the acquisition signal.
c. At each acquisition, the phantom reads out the image number (it counts the number of images the fMRI takes) and the position at that moment in interrupts.
  i. This output is displayed on the user interface screen (e.g., Display Output 1325) in real time.
d. As images are acquired, the phantom compares the current time to the timestamp column of the experimental input to determine where to rotate. When the current time matches a timestamp, it is referred to as a "stimulus."
e. If the phantom receives a stimulus that is greater than its current position, it activates the corresponding valve to rotate towards that position. If the stimulus is less than its current value, it activates the opposite valve.
  i. For example, if the experiment begins, the current position is 0. A stimulus is received at time t = 2 s. It designates a position of 2. The phantom will then begin rotation towards this destination. If the phantom reaches the destination without receiving another stimulus, it then rotates back to home (0).
  ii. The microcontroller determines the direction the phantom is spinning by which valve it has activated. This ultimately determines whether a detected interrupt is a +1 or a −1 from its current position.
4. Experiment completion
  a. Phantom output is copied and pasted into an excel file for analysis, which can be stored in Storage Device 1305.

Empirical Testing
Control Unit and FMRI Communication

TR signals are sent to the Arduino (which is an example of a CPU 1300) through USB input (e.g., via USB connector 1315) from the fMRI. To properly calibrate the phantom rotation and avoid motion artifacts in regions of interest, a simple EPI acquisition can be run (TR=2, TE=30 ms, 25 slice) where the phantom begins rotation just after the start of each TR, and each slice is examined for motion artifacts.

FIG. 9c is a conceptual representation of pseudo-BOLD signal production mechanism (top), and empirically measured signal change (bottom). Automated and precisely timed rotation of the phantom between two calibrated agarose gels within a region-of-interest produces smoothly varying hemodynamic response-like signal changes. Here, agarose gel concentrations were 2.21% (gel 1) and 2.27% (gel 2). Data shown are extracted from a simple event-driven design via trigger averaging with an 18 TR window. Region of interest is a 3×3 voxel square.

Figures 10A, 10B, 10C, 10D:
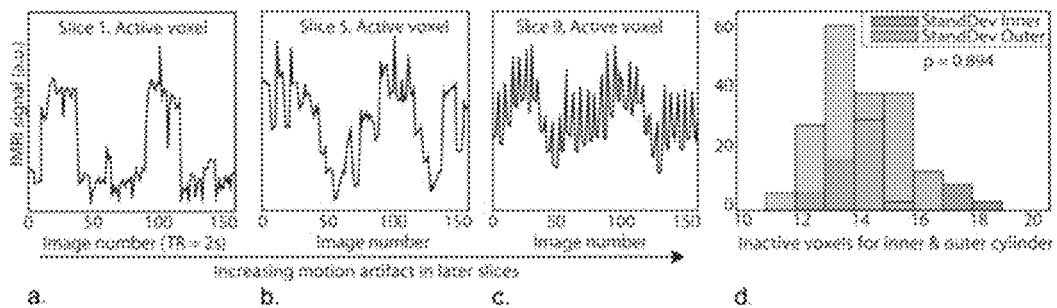
FIG. 10a-10c include graphs illustrating motion artifacts during rotation vs. slice for a phantom according to one embodiment of the invention.
FIG. 10d is a table showing standard deviations for inner and outer cylinder voxels for slices of interest according to one embodiment of the invention.

As shown in FIG. 10c, severe motion artifacts occur when the phantom is rotating during or before a slice is acquired, whereas slices acquired before the phantom rotates within a TR contain considerably less artifact. Therefore, if the phantom is programmed to begin rotation towards the end of a TR (after a sufficient number of slices have been acquired) and to stop rotation just before the next TR, motion artifacts are negligible (see Results). Empirical testing with this design suggests that the phantom should begin rotation 650 ms prior to each TR, and stop approximately 100 ms before the TR. Thus, for TR=2s, the dynamic phantom begins rotation at 1350 ms and ends at 1900 ms.

Control Unit Software

Software for the Arduino Mega controller (e.g., CPU 1300) permits the phantom to operate in three distinct modes: 1) stimulus-driven, 2) guided, and 3) rest.

FIG. 10a-10c include graphs illustrating motion artifacts during rotation vs. slice for a phantom according to one embodiment of the invention. The dynamic phantom rotates between 3-6° between TRs. Rotation is coupled with TR acquisition through a microcontroller, and is tightly controlled with a brake. For demonstration purposes, we show here that slices acquired before rotation (10a) are subject to considerably less spiking than slices acquired during rotation (10b) and after rotation is completed (10c). As shown in FIG. 10d, the rotation/braking scheme was optimized such that inner cylinder voxels contain no significant differences in standard deviation for slices of interest (rank sum test).

In stimulus-driven mode, the user enters onsets and "amplitudes" of each stimulus. The phantom is programmed to respond to the onset of a "stimulus" by mimicking a simple hemodynamic response function, with a gradual rise and fall over approximately 16 seconds. Thus, when the phantom receives an input, it begins rotation towards a designated "amplitude." which corresponds directly to an interrupt number. When the stimulus-specific amplitude is reached, the phantom begins returning to baseline. If another stimulus is received during this cycle, the phantom begins rotation towards the new amplitude. In this way, the dynamic phantom is capable of producing biomimetic fMRI time series.

In resting-state mode, the user enters a desired interruption destination for each TR. The phantom will receive a new instruction (interrupt number) at each TR. This mode is useful for the production of specific time-series, such as a time-series with pink-noise frequency characteristics observed in resting-state fMRI as shown in FIG. 11a.

In static mode, the phantom is used to measure baseline noise levels in the absence of BOLD-like signal. The culmination of these features is a flexible and modular architecture through which the phantom can easily be made to perform a wide variety of experimental designs.

FIG. 9d includes graphs illustrating dynamic phantom data acquisition for a phantom according to one embodiment of the invention. The inner cylinder of the phantom rotates back and forth between TRs, producing signal changes at the gel-gel interfaces (top panels, left and right). The top two panels demonstrate "active" voxels within the inner cylinder of the phantom along the gel-gel interfaces; these voxels exhibit strong input-output fidelity Voxels distant from the interfaces and within the static (non-rotating) outer cylinder experience uncorrelated scanner noise (bottom panels, left and right). The bottom two panels show that the inactive outer cylinder and inactive inner cylinder voxels are indistinguishable.

Figures 11A, 11B:
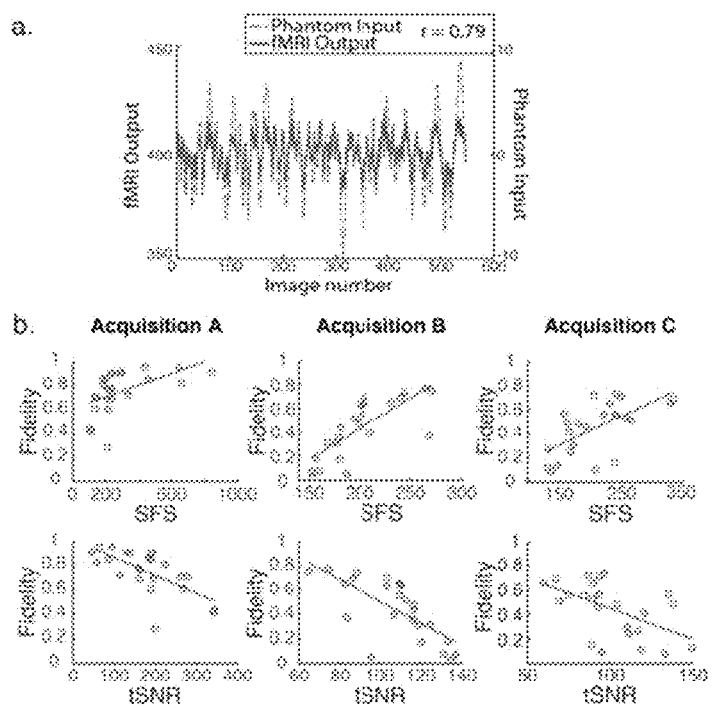
FIGS. 11a and 11b include graphs illustrating dynamic phantom data acquisition for a phantom according to one embodiment of the invention.

FIG. 11a-11b include graphs illustrating validation of dynamic phantom biomimetic capabilities for a phantom according to one embodiment of the invention. To accurately mimic human resting-state fluctuations in the dynamic phantom, we utilized a complex pink-noise waveform as shown by the dotted line in FIG. 11a. The 10-minute input function originated from our previous neuroimaging data and was subsequently programmed into the phantom. The dynamic phantom inputs are derived from position tracking during rotation. A representative output fMRI signal is superimposed (fMRI Output axis), as acquired under Acquisition B: 3T magnet, 64 Channel head-coil, at TR=1080 ms. This waveform input was used for all nine phantom fMRI scans. Input-output fidelity was positively correlated with Signal Fluctuation Sensitivity) SFS (median r=0.67) and negatively correlated with temporal signal to noise ratio tSNR (median r=−0.63) as shown in FIG. 11b. Groups presented here match the scanning parameters presented in subsequent human data: Acquisition A is a 3 Tesla magnet with a 32-channel headcoil (TR=2000 ms), Acquisition B is a 3 Tesla magnet with a 64-channel headcoil (TR=1080 ms), and Acquisition C is a 7 Tesla magnet with a 32-channel head coil (TR=802 ms).

FIG. 12 includes graphs that illustrate the use of gradients in within the contrast compartment that permits improved control over phantom dynamic inputs. (left) Colored spheres represent regions of interest in each quadrant made active with rotation across gradients. For a scanner with optimal dynamic fidelity, Signals 1-4 should be perfectly correlated (i.e. would have correlation coefficient r=1). Correlations and anti-correlations created due to the gradient are used to automate detection of artifact and to establish geometry for defining regions of interest in the context of spatial distortion. (right) fMRI (3T) T2* map of an agarose cartridge with 4 concentrations per quadrant.

Experimental Paradigm

The dynamic phantom was scanned with three different fMRI scanners. The three scanners utilized were the following: (i) a 3T Siemens MRI with 32-channel head-coil (McGovern Institute for Brain Research, Massachusetts Institute of Technology), (ii) a 3T Siemens MRI with 64-channel head-coil (Human Connectome Scanner—Martinos Center for Biomedical Engineering, Massachusetts General Hospital), and (iii) a 7T Siemens MRI with 32-channel head-coil (Martinos Center for Biomedical Engineering, Massachusetts General Hospital). For each scanner, 180, the contents of which are incorporated by reference in its entirety). For both 3T scanners, we performed standard shimming; due to dramatically increased susceptibility artifacts at 7T, we utilized a partial shim centered on the inner cylinder of the phantom. Visual inspection of the resulting images, as well as correlations between the Dynamic phantom inputs and fMRI outputs, confirmed data quality.

To assess SFS and tSNR, we programmed the dynamic phantom to mimic resting-state oscillations observed in human fMRI (van den Heuvel et al., 2008) (FIG. 11a), and scanned the dynamic phantom under three different sets of acquisition parameters. Acquisition A represents what would normally be considered to be the standard for typical resting-state studies, using a 3T scanner with 32-channel head coil and 2000 ms temporal-resolution (TR). Acquisition B uses a set of parameters that were specifically designed for resting-state connectivity analyses as part of the Human Connectome Project. These include a 3T scanner that increases the temporal-resolution to 1080 ms in order to achieve greater sensitivity to fluctuation dynamics; to compensate for signal loss associated with accelerated scanning. Acquisition B uses a custom-built 64-channel head coil. Acquisition C pushes even further than Acquisition B in optimizing over temporal resolution (802 ms). Acquisition C retains the 32-channel head coil, but compensates for signal loss associated with accelerated scanning by increasing the field strength to 7T. In each scanner, we scanned the dynamic phantom for 10 minutes under each acquisition paradigm optimized for human studies, as well as at two other TRs comparable to those previously optimized for the other two scanners.

The bold rows in Table 2 below indicate scans where corresponding human data was collected. Scan 1 corresponds to Acquisition A, Scan 5 corresponds to Acquisition B and Scan 9 corresponds to Acquisition C.

Acquisition Parameters

The acquisition parameters are shown in Table 1 of DeDora et al., which as noted above, the contents are incorporated by reference in its entirety.

Table 1 of DeDora et al. is shown below referenced herein as Table 2:

TABLE 2

| Scan | Main Field | Head Coil | TR (ms) | TE (ms) | SMS | iPAT | Flip Angle | Bandwidth (Hz/Px) | Resolution (mm) | Slice Gap (mm) | Slices |
|---|---|---|---|---|---|---|---|---|---|---|---|
| 1 | 3T | 32 Ch | 2000 | 30 | 3 | 2 | 75° | 1860 | 2 × 2 × 2 | 0.2 | 69 |
| 2 | 3T | 32 Ch | 1080 | 30 | 4 | 2 | 60° | 1860 | 2 × 2 × 2 | 0.2 | 60 |
| 3 | 3T | 32 Ch | 802 | 30 | 5 | 2 | 33° | 1860 | 2 × 2 × 2 | 0.2 | 55 |
| 4 | 3T | 64 Ch | 2000 | 30 | 2 | 2 | 85° | 2840 | 2 × 2 × 2 | 0 | 62 |
| 5 | 3T | 64 Ch | 1080 | 30 | 4 | 2 | 60° | 2840 | 2 × 2 × 2 | 0 | 68 |
| 6 | 3T | 64 Ch | 824 | 30 | 5 | 2 | 55° | 2840 | 2 × 2 × 2 | 0 | 65 |
| 7 | 7T | 32 Ch | 2010 | 20 | 2 | 2 | 33° | 2264 | 2 × 2 × 1.5 | 0 | 86 |
| 8 | 7T | 32 Ch | 1010 | 20 | 4 | 2 | 55° | 2264 | 2 × 2 × 1.5 | 0 | 84 |
| 9 | 7T | 32 Ch | 802 | 20 | 5 | 2 | 33° | 2368 | 2 × 2 × 1.5 | 0 | 85 | three sampling rates were studied, representing typical time-resolution for fMRI studies (TR=2000-2010 ms), increased time-resolution acquired for the Human Connectome Project (TR=1010-1080 ms), and ultra-fast imaging paradigms (TR=802-824 ms). Thus, we performed a factorial study (three scanners and three sampling rates each) with the Dynamic phantom, for a total of nine scans, each 10 minutes long (as shown in Table 1 of DeDora at el., "Signal Fluctuation Sensitivity: An Improved Metric for Optimizing Detection of Resting-State fMRI Networks", FRONTIERS IN NEUROSCIENCE, published May 4, 2016, Volume 10, Article Statistical Analysis The standard measure for establishing the quality of task-based data has been the contrast-to-noise ratio (CNR), defined as the contrast (mean activation level acquired during task minus the mean activation level acquired during rest) divided by the standard deviation of the time-series (Bandettini and Cox, 2000). For task-free designs however, CNR cannot be computed, and thus normally is replaced by the temporal signal-to-noise ratio (tSNR), defined as the mean of the time-series divided by its standard deviation (Kruger et al., 2001). Intuitively, both CNR and tSNR compare the amplitude of a signal against a background of undesired physiological, thermal, and scanner noise present in all fMRI studies. This manner of conceptualizing what is 'signal' versus what is 'noise' makes perfect sense within the context of activation maps, in which a task activates the brain reliably more under one condition (signal) than another (noise) (Murphy et al., 2007). However, for task-free analyses, the 'baseline' fluctuations themselves also include the 'signal.' Thus, for most task-free analyses, tSNR would appear to do exactly the opposite of what one would wish, as it penalizes sensitivity to the fluctuations (i.e., the standard deviation of the time-series) upon which experimental results are also based. Indeed, several recent studies have reported little correspondence between resting-state tSNR and the detection of stable functional networks (Smith et al., 2013; Welvaert and Rosseel, 2013; Gonzalez-Castillo et al., 2014; Molloy et al., 2014)

For task-free analyses, rather than relegate time-series fluctuations to the category of noise as per tSNR, we want to—as with task-based analyses—functionally distinguish between fluctuations of interest that are neurobiologically significant (e.g., emanating from BOLD signal consequent to neuronal response) from fluctuations of nuisance that are neurobiologically insignificant (e.g., physiological, scanner, and motion artifact). We discovered that the dissociation between the two can be characterized by signal-fluctuation sensitivity (SFS), which we define at a single-voxel level as:

$$SFS_{voxel} = \frac{\mu_{ROI}}{\langle \mu_{global} \rangle} \times \frac{\sigma_{ROI}}{\langle \sigma_{nuisance} \rangle} \qquad \text{Eqn. 1}$$

In the first term, the numerator consists of the mean signal (μ) of a time-series acquired from a voxel in the region of interest (RO). For the denominator, we average over all voxel-specific signal for the entire brain (global). The first term ensures that SFS decreases for regions with signal drop out, while remaining unit-less (as with tSNR). In the second factor, the numerator consists of the standard deviation (σ) of the time-series acquired from the voxel of interest. For the denominator, we average over all voxel-specific σ from a region in which BOLD signals are not expected, but in which physiological, scanner, and motion artifacts are still present (nuisance). Prior work suggests that time-series obtained from cerebrospinal fluid (CSF) meet criteria for the nuisance denominator (Wald, 2012). SFS for a region of interest is then computed by averaging voxel-specific SFS values over all voxels in the region ($SFS_{ROI} = \langle SFS_{voxel} \rangle_{ROI}$). In order to more easily compare SFS with tSNR, we scale them comparably by multiplying SFS values by 100.

While most human fMRI data undergoes significant preprocessing, for the dynamic phantom, we used raw data after implementing only voxel-wise trend removal (linear and quadratic) to remove scanner drift, and no further temporal preprocessing, in order to characterize dynamic fidelity as transparently as possible. For the region of interest (ROI) fluctuations, we extracted the average time-series from the four quadrants of the inner cylinder (corresponding to the four chambers, with respect to the initial position of the phantom) with an automated masking procedure using MATLAB software developed in-house. We repeated this for six slices positioned in the center of the phantom (n=24 time-series per scan). For the nuisance fluctuations, we extracted the time-series from the outer cylinder of the phantom, which does not activate. We then computed quadrant-wise SFS based on the definition:

$$SFS_{dynamic\ phantom\ quadrant} = \frac{\langle \mu_{inner\ cylinder} \rangle_{quadrant}}{\langle \mu_{global} \rangle} \times \frac{\langle \sigma_{inner\ cylinder} \rangle_{quadrant}}{\langle \sigma_{outer\ cylinder} \rangle} \qquad \text{Eq. 2}$$

In the first term, the numerator consists of the mean signal (μ) of an averaged time-series over each of the four dynamic phantom quadrants (quadrant). For the denominator, we average over signal for the entire phantom (global). The first term ensures that SFS decreases for regions with signal drop out, while remaining unit-less (as with tSNR). In the second term, the numerator consists of the mean standard deviation (σ) of an averaged time-series over each of the four dynamic phantom quadrants. For the denominator, we average over σ from a region in which signals are not expected, but in which physiological, scanner, and motion artifacts are still present. In this case, we use the outer cylinder, which is static. In order to avoid biasing values for standard deviation due to differences in the number of voxels between inner quadrants and outer cylinder, we averaged time-series in the outer compartment over the same number of voxels used to average time-series in each of the inner quadrants. We computed standard deviations for each of these inner quadrant-sized (39 voxel) averaged time-series, and then averaged across those standard deviations to produce the standard deviation for the entire outer cylinder (i.e., the denominator of the second factor). In order to more easily compare SFS with tSNR, we scale them comparably by multiplying SFS values by 100. tSNR was computed as the mean for the averaged time-series over each of the four dynamic phantom quadrants, divided by its standard deviation (after detrending). Dynamic fidelity was computed as the correlation between inputs (dynamic phantom user-defined function) and outputs (fMRI time-series). We then computed the correlation between fidelity and both SFS and tSNR for each of the 24 time-series per scan.

The correlation results are shown in Table 2 of DeDora et al. (which as previously noted is incorporated by reference) which is shown below as Table 3:

TABLE 3

| | TR (ms) | 3T, 32 Ch | 3T, 64 Ch | 7T, 32 Ch |
|---|---|---|---|---|
| | | Correlation with Dynamic Fidelity | | |
| SFS | ~2000 | 0.51 (p = 0.010) | 0.69 (p = 2.1 × $10^{-4}$) | 0.54 (p = 6.6 × $10^{-3}$) |
| | ~1080 | 0.71 (p = 1.1 × $10^{-4}$) | 0.76 (p = 1.8 × $10^{-5}$) | 0.69 (p = 1.9 × $10^{-4}$) |
| | ~802 | 0.67 (p = 3.7 × $10^{-4}$) | 0.49 (p = 0.014) | 0.63 (p = 9.0 × $10^{-4}$) |
| tSNR | ~2000 | −0.67 (p = 3.2 × $10^{-4}$) | −0.64 (p = 7.0 × $10^{-4}$) | −0.44 (p = 0.030) |
| | ~1080 | −0.87 (p = 4.6 × $10^{-8}$) | −0.72 (p = 8.3 × $10^{-5}$) | −0.58 (p = 3.0 × $10^{-3}$) |
| | ~802 | −0.63 (p = 1.1 × $10^{-3}$) | −0.27* (p = 0.20) | −0.54 (p = 6.2 × $10^{-3}$) |

Dynamic fidelity is defined as the correlation between user-defined dynamic inputs, provided by the phantom rotation, and dynamic outputs acquired from the scanner in the region of interest. Dynamic fidelity directly correlated with SFS for each of the nine scans (FIG. 11b; Table 3; median r=0.67) and inversely correlated with tSNR for each of the nine scans (FIG. 11b; Table 3; median r=−0.63). Thus, when the scanner was most sensitive in capturing dynamic inputs, SFS was maximized while tSNR was minimized, and vice-versa.

Results

Motion Artifact Mitigation. An initial proof of concept sought to test whether motion artifacts could be avoided via precisely timed rotation of the phantom. First, we explored time-series resulting from our preliminary tests, as described herein and presented in FIG. 9c. After calibrating phantom rotation and acquiring event-driven data, we extracted two representative slices of interest from our phantom volume (images 6 and 7). Due to the interleaved odd-first slice acquisition, image 7 was acquired prior to rotation, while image 6 was acquired post-rotation. For image 7, rank sum tests between inactive inner cylinder voxels and outer cylinder voxels revealed no significant differences in standard deviation of the signals ($SD_{inner}$=13.5, $SD_{inner}$ 14.75, p=0.894). As expected, image 6 showed significantly higher standard deviations in the inner cylinder than both the outer cylinder ($SD_{inner}$=15.39. $SD_{outer}$=13.1, $p<1\times10^{-9}$) and inner cylinder from image 7 ($p<1\times10^{-3}$).

Time-Series Analysis. Next, phantom data for activated voxels was explored. Time series were extracted from within gel-gel interfaces (expected to show activation), as well as time-series from between interfaces and the outer cylinder (not expected to show activation). Results for image 7 are demonstrated in FIG. 9d. As expected, we found that phantom inputs (interrupt readings) were significantly correlated with fMRI data at gel-gel interfaces; these areas displayed signal voxel percent signal change (computed as (Max(X)−Min(X))/Mean(X)) of between 3-7%. Between image 5 and 12 (excluding slices at the top and bottom edges of the phantom), a total of 3,352 voxels demonstrated correlations (r>0.25) with phantom inputs.

Simulating the Hemodynamic Response. As a demonstration of the practical applications of the present dynamic phantom, we sought to test whether the dynamic phantom could produce realistic physical simulations of the biological hemodynamic response function (HRF). If so, the phantom could be used to optimize scan parameters (for example: TR, SMS factor) for the extraction of HRFs in the absence of physiological variables, which are known to reduce intra- and inter-scanner reproducibility (Friedman, Stem et al. 2008). A trigger averaging routine was employed to extract the average response function of the phantom following a "stimulus" in stimulus-driven mode. As predicted, the phantom produced a realistic HRF, shown in FIG. 9d Discussion This discussion of prototype testing details the development and validation of a dynamic BOLD phantom for fMRI. This phantom is completely MR-compatible, fully automated, and is capable of producing complex inputs to mimic biological hemodynamics. To validate the dynamic phantom, we explored both active and inactive time-series from the inner cylinder, as well as inactive outer cylinder time-series. Finally, we demonstrated a biomimetic hemodynamic response produced with the phantom.

Materials and Design. Undoped agarose gels were used to produce BOLD-like signal changes. Doping these gels could help tailor both T and $T_2$ relaxation times for specific uses (Olsrud, Nilsson et al. 2008). Additionally, other hydrogels or similar materials may be suitable for use within the dynamic phantom. For example, poly(dimethylsiloxane) (PDMS) can also be calibrated for specific relaxation properties (Dreiss, Cosgrove et al. 2007).

A custom MR-compatible motor was developed to drive rotation of the phantom. This motor allows for precise rotation in either direction. If necessary, greater flexibility could be afforded by modifying the number of gears and their ratios. Furthermore, inclusion of a gene-va mechanism could grant phantom operators an exact amount of rotation per pulse.

Phantom rotation is monitored continuously through an interrupter disc. A 1.5 mm diameter fiber optic cable was chosen to ensure sufficient illumination was attained with our LED and photodiode setup. The spacing between the teeth of the interrupter disc was designed to closely match the diameter of the fiber optic cable used, ensuring full interruption. Thus, finer control of the phantom could be achieved with a combination of reduced fiber-optic-cable diameter and interrupter tooth size. Furthermore, the interrupter disc could be replaced with a continuously variable translucent color wheel, which would allow the phantom to be tracked continuously by color.

Mitigation of Motion Artifacts. The phantom produces BOLD-like signal changes by moving differentially calibrated agarose gels in and out of a volume of interest. In fMRI studies, motion is considered a significant source of noise; many previous studies report reduced connectivity in populations less likely to remain still during fMRI scanning—children, the elderly, and the mentally ill (Power, Schlaggar et al. 2015). Many methods for motion correction have been presented, including standard coregistration, regression (Rubin, Fekete et al. 2013), and removal of affected images (Power, Barnes et al. 2012). Indeed, the hand-cranked fMRI phantom developed by Olsrud et al. (Olsrud, Nilsson et al. 2008) required the removal of images during which movement occurred.

A phantom according to the present invention avoids motion artifacts in regions of interest by precisely timing its rotation to begin 650 ms before the onset of a TR, and finish before TR onset. This strategy allows most of the phantom to be imaged without motion-artifacts. Indeed, no significant differences were found between inner and outer cylinder standard deviations in slices acquired before rotation; as expected, significantly higher standard deviations were found in the inner cylinder during slices acquired after rotation onset. It is also important to note that inner cylinder voxels outside of the gel-gel interface that contain air pockets or gel inhomogeneities may experience larger standard deviations than the outer cylinder, due to the passing of these impurities through voxels-of-no-interest. Thus, it is critically important to properly de-gas phantom cylinders and to ensure gel homogeneity during development of a rotation phantom.

Just as a dynamic phantom according to the invention can use settings that avoid motion artifacts, for establishing the impact of motion and for developing methods that mitigate that impact with respect to the fMRI signal, the same phantom can use different settings to deliberately produce the types of motion artifacts typically found when imaging human subjects. For example, the phantom can be programmed to periodically rotate out of sync with fMRI pulses, causing single- or multi-frame motion artifacts (spikes) at designated times within a study. This type of data could significantly improve current models of motion in fMRI (Drobnjak, Gavaghan et al. 2006).

fMRI Signal Production. At the single-voxel level, we found that the dynamic phantom produced maximum percent signal changes (PSC) of 5% with agarose concentrations of 2.21% and 2.27%. This represents a high but biologically feasible level (Olsrud, Nilsson et al. 2008). fMRI time-series, however, are typically represented as an average across a region-of-interest. This exemplary phantom design utilizes partial volume effects (see FIG. 9C) to achieve variable PSC, ranging from nearly 0% (if slightly less than half of the inner cylinder is used as an ROI) to up to 5%. In this way, a wide range of biologically and analytically relevant PSCs are produced.

Using this exemplary design, the phantom was programmed to simulate a hemodynamic response following a virtual "stimulus." The extracted response function closely mirrors the biological hemodynamic response, especially after filtering. The post-stimulus undershoot appearing in the filtered response function is an artifact of filtering, and not an observation of fMRI "transients" discussed by Renvall et al. (Renvall and Hari 2009); here, no evidence was found of transients following changes in fMRI signal. Two possibilities for this are suggested. First, the agarose phantom may produce changes in fMRI signal too slowly to reproduce this type of signal artifact. However, the biological hemodynamic response is also slow as compared to neural activity, so speed of fMRI signal change is unlikely to influence transient signal production. Second, the Maxwell coils in Renvall's fMRI phantom could interact with fMRI in unforeseen ways, perhaps briefly storing and releasing small charges in response to rapidly changing RF fields within the headcoil. Further study with the agarose phantom will shed light on this issue.

A dynamic phantom according to the present invention represents a device and method capable of addressing a pressing question in functional imaging: to what extent does the scanner accurately capture the fidelity of dynamic signals? In contrast to both the use of human subjects, in which input signals are unknown and physiological noise confounds analysis, and the use of simulations, which often rely on limited understanding of complex phenomena, the dynamic phantom produces complex fMRI signal with known inputs and allows the study of real scanner noise. In combination with recent work describing the removal of physiological noise sources (Birn 2012) and best practices for removal of motion (Power, Schlaggar et al. 2015), this phantom may be used to characterize and eliminate scanner noise in the presence of dynamic fMRI signals.

A dynamic phantom according to the invention establishes an objective and quantifiable measure of "temporal integrity and fidelity"; i.e., the scanner's ability to accurately capture the dynamics of the brain's response. As such, as those of skill in the art will appreciate, the phantom has applications that include calibration, optimization of acquisition parameters, and interpretation of both research and clinical applications of fMRI that depend upon signal dynamics.

The CPU 1300 described herein can be a microcontroller (as described in the testing) or microprocessor or any other processing hardware. The Storage Device 1305 can be memory, such as, but not limited to, RAM. ROM and persistent storage. The CPU 1300 can be configured to execute one or more programs stored in a computer readable storage device. The computer readable storage device can be RAM, persistent storage or removable storage. A storage device is any piece of hardware that is capable of storing information, such as, for example without limitation, data, programs, instructions, program code, and/or other suitable information, either on a temporary basis and/or a permanent basis.

Detailed embodiments of the present disclosure are described herein; however, it is to be understood that the disclosed embodiments are merely illustrative of the compositions, structures and methods of the disclosure that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the compositions, structures and methods disclosed herein. References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment.

While the fundamental novel features of the disclosure as applied to various specific embodiments thereof have been shown, described and pointed out, it will also be understood that various omissions, substitutions and changes in the form and details of the devices illustrated and in their operation, may be made by those skilled in the art without departing from the spirit of the disclosure. For example, it is expressly intended that all combinations of those elements and/or method steps which perform substantially the same function in substantially the same way to achieve the same results are within the scope of the disclosure. Moreover, it should be recognized that structures and/or elements and/or method steps shown and/or described in connection with any disclosed form or embodiment of the disclosure may be incorporated in any other disclosed or described or suggested form or embodiment as a general matter of design choice. It is the intention, therefore, to be limited only as indicated by the scope of the claims appended hereto.

What is claimed is:

1. An apparatus for use with a functional magnetic resonance imaging (fMRI) device, comprising:
   (a) an fMRI-compatible housing;
   (b) an fMRI-compatible support structure, the support structure being cylindrical and concentric with the housing, the support structure being within the housing;
   (c) an fMRI-compatible rotor within the housing, the support structure surrounding the rotor;
   (d) a first magnetic-resonance-contrast-producing material filling a space between an outer surface of the rotor and an inner surface of the housing;
   (e) one or more suitable other magnetic-resonance-contrast-producing materials filling a space within the rotor, such that longitudinal rotation of the rotor produces biomimetic hemodynamic signals that are detected by the fMRI device; and
   (f) an fMRI-compatible actuator operatively connected to the rotor.

2. The apparatus as claimed in claim 1, further comprising:
   (g) a power unit capable of powering the actuator;
   (h) a control unit operatively connected to the power unit and the actuator;

(i) a position indicator operatively connected to the rotor; and (j) a feedback unit operatively connected to the position indicator and the control unit.

3. The apparatus as claimed in claim 1, wherein the housing is substantially cylindrical.

4. The apparatus as claimed in claim 1, wherein the housing is substantially symmetrical.

5. The apparatus as claimed in claim 1, wherein the housing is substantially asymmetrical.

6. The apparatus as claimed in claim 5, wherein the housing is generally anthropomorphic.

7. The apparatus as claimed in claim 1, wherein the rotor is substantially cylindrical.

8. The apparatus as claimed in claim 7, wherein the rotor is substantially concentric with the housing.

9. The apparatus as claimed in claim 1, wherein the actuator is capable of imparting dual rotation to the rotor.

10. The apparatus as claimed in claim 1, further comprising a removable divider that forms a plurality of longitudinal compartments within the rotor.

11. The apparatus as claimed in claim 10, wherein the removable divider forms two longitudinal compartments.

12. The apparatus as claimed in claim 10, wherein the removable divider forms four longitudinal compartments.

13. The apparatus as claimed in claim 12, wherein the first magnetic-resonance-contrast-producing material has a first concentration and the other magnetic-resonance-contrast-producing materials comprise a second material having a second concentration and a third material having a third concentration, and the second and third materials alternate in each of the four compartments.

14. The apparatus as claimed in claim 13, wherein the first concentration differs from the second concentration.

15. The apparatus as claimed in claim 13, wherein the first concentration is differs from the third concentration.

16. The apparatus as claimed in claim 13, wherein the first concentration differs from the second and third concentrations.

17. An apparatus for use with a functional magnetic resonance imaging (fMRI) device, comprising:
(a) an fMRI-compatible housing;
(b) an fMRI-compatible support structure, the support structure being cylindrical and concentric with the housing, the support structure being within the housing;
(c) an fMRI-compatible rotor that:
is surrounded by the support structure such that a first magnetic-resonance-contrast-producing material is contained in a space between an outer surface of the rotor and an inner surface of the housing; and
is capable of longitudinal rotation that, when the rotor contains one or more suitable other magnetic-resonance-contrast-producing materials, produces biomimetic hemodynamic signals that are detected by the fMRI device; and
(d) an fMRI-compatible actuator operatively connected to the rotor.

18. The apparatus as claimed in claim 17, further comprising:
(e) a power unit capable of powering the actuator;
(f) a control unit operatively connected to the power unit and the actuator;
(g) a position indicator operatively connected to the rotor; and
(h) a feedback unit operatively connected to the position indicator and the control unit.

19. A method for using a functional magnetic resonance imaging (fMRI) device, comprising:
placing first, second, and third magnetic-resonance-contrast-producing materials within an apparatus comprising:
(a) an fMRI-compatible housing;
(b) an fMRI-compatible support structure, the support structure being cylindrical and concentric with the housing, the support structure being within the housing;
(c) an fMRI-compatible rotor within the housing, the support structure surrounding the rotor, the first magnetic-resonance-contrast-producing material filling a space between an outer surface of the rotor and an inner surface of the housing;
and the second and third magnetic-resonance-contrast-producing materials filling a space within the rotor, such that longitudinal rotation of the rotor produces biomimetic hemodynamic signals that are detected by the fMRI device; and the apparatus further comprising
(d) an fMRI-compatible actuator operatively connected to the rotor;
causing the actuator to rotate the rotor; and
detecting the biomimetic hemodynamic signals.

* * * * *